United States Patent [19]

Chen et al.

[11] Patent Number: 5,041,900

[45] Date of Patent: Aug. 20, 1991

[54] SEMICONDUCTOR DEVICE HAVING SEALED ELECTRICAL FEEDTHROUGH

[75] Inventors: Frank Chen, Swindon; Tony W. Rogers, Stoke Pages, both of England; David E. Blackaby, West Suffield, Conn.

[73] Assignee: Hamilton Standard Controls, Inc., Farmington, Conn.

[21] Appl. No.: 366,556

[22] Filed: Jun. 15, 1989

Related U.S. Application Data

[62] Division of Ser. No. 227,849, Aug. 3, 1988, Pat. No. 4,849,374

[30] Foreign Application Priority Data

Aug. 6, 1987 [GB] United Kingdom ............... 8718637

[51] Int. Cl.[5] .......................... H01G 7/00; G01L 9/12
[52] U.S. Cl. ...................................... 357/73; 361/283; 73/718; 73/724; 357/26; 357/55
[58] Field of Search ................. 361/283; 73/718, 724; 357/26, 73

[56] References Cited

U.S. PATENT DOCUMENTS

| 4,345,299 | 8/1982 | Ho ........................................ 73/724 |
| 4,380,041 | 4/1983 | Ho ........................................ 73/724 |
| 4,390,925 | 6/1983 | Freud ................................... 361/283 |
| 4,426,673 | 1/1984 | Bell et al. ............................ 361/283 |
| 4,467,394 | 8/1984 | Grantham et al. ................. 361/283 |
| 4,495,820 | 1/1985 | Shimada et al. .................... 361/283 |
| 4,525,766 | 6/1985 | Petersen .............................. 357/51 |
| 4,530,029 | 7/1985 | Beristain ............................ 361/283 |
| 4,565,096 | 1/1986 | Knecht ............................... 361/283 |
| 4,578,735 | 3/1986 | Knecht et al. ..................... 73/724 |
| 4,612,599 | 9/1986 | Ziegler ............................... 73/724 |
| 4,625,561 | 12/1986 | Mikkor ............................. 73/724 |
| 4,628,403 | 12/1986 | Kuisma ............................ 361/283 |
| 4,647,133 | 3/1987 | Renker et al. ................... 339/97 R |
| 4,675,960 | 6/1987 | Higgins, Jr. ..................... 361/283 |
| 4,701,826 | 10/1987 | Mikkor ........................... 361/283 |
| 4,773,972 | 9/1988 | Mikkor ............................ 73/718 |
| 4,831,492 | 5/1989 | Kuisma ........................... 361/283 |
| 4,838,088 | 6/1989 | Murakami ...................... 361/283 |
| 4,849,374 | 7/1989 | Chen et al. ..................... 437/209 |
| 4,862,317 | 8/1989 | Kuisma ........................... 361/283 |
| 4,949,581 | 8/1990 | Rud, Jr. .......................... 361/283 |

FOREIGN PATENT DOCUMENTS

| 55-44786 | 3/1980 | Japan ..................................... 357/26 |
| 57-10270 | 1/1982 | Japan ..................................... 357/26 |
| 58-55732 | 4/1983 | Japan . |

Primary Examiner—Andrew J. James
Assistant Examiner—Viet Q. Nguyen

[57] ABSTRACT

A method of hermetically sealing an electrical feedthrough (5) in a semiconductor-on-insulator device comprising the steps of producing an electrically insulating layer (2) on a semiconductive material (1) having a first surface area, producing one or more electrodes (4) on a non-conductive substrate (3) of a second surface area which may be greater than the first surface area, with each electrode having an electrical feedthrough (5) associated therewith, placing the semiconductive layer on the substrate with the insulating layer in contact with the substrate and such that each electrical feedthrough extends beyond the edge of the semiconductive layer, and bonding the semiconductive layer to the substrate to provide an hermetic seal around the feedthrough and thus protect the integrity of the electrode associated therewith and disposed between the semiconductive layer and the substrate.

4 Claims, 8 Drawing Sheets

SEMICONDUCTOR DEVICE HAVING SEALED ELECTRICAL FEEDTHROUGH

This is a division of copending application Ser. No. 227,849, filed on Aug. 3, 1988, now U.S. Pat. No. 4,849,374, and claiming priority from British application Ser. No. 8,718,637, filed Aug. 6, 1989.

This invention relates to a method of sealing an electrical feedthrough or connection in a semiconductor device.

A semiconductor device commonly comprises a layer of semiconductive material bonded to a non-conductive substrate, typically silicon being the semiconductive material and glass the substrate. The substrate may comprise an electrode which is disposed between the semiconductive layer and the substrate but which has an electrical feedthrough extending therefrom and terminating at a point beyond an edge of the semiconductive layer for connection to external circuitry. Such an arrangement is common in capacitive pressure sensors, accelerometers, etc. Many attempts have been made to overcome this problem of sealing electrical feedthroughs in semiconductor devices, some of the solutions put forward being that of employing diffused feedthroughs, providing etched tunnels for the feedthroughs, which tunnels are subsequently filled, and providing conductive glass channels, for example. Problems commonly encountered with these approaches are high series resistance, poor electrical isolation, gas leakage paths and complicated, and hence expensive, process steps.

It is an object of the present invention to provide a method of sealing an electrical feedthrough for a semiconductor device which overcomes the aforementioned problems in a relatively simple manner.

According to the present invention there is provided a method of hermetically sealing an electrical feedthrough in a semiconductor-on-insulator device comprising the steps of:

a) producing an electrically insulating layer on a layer of a semi-conductive material having a first surface area, b) producing one or more electrodes on a non-conductive substrate of a second surface area greater than the first surface area, with each electrode having an electrical feedthrough associated therewith, c) placing the semiconductive layer on the substrate with the insulating layer in contact with the substrate and such that each electrical feedthrough extends beyond an edge of the semiconductive layer, and d) bonding the semiconductive layer to the substrate to provide an hermetic seal around the feedthrough and thus protect the integrity of the electrode associated therewith and disposed between the semiconductive layer and the substrate.

The bonding step is preferably accomplished using the field-assisted bonding process which is sometimes referred to as anodic bonding, Mallory bonding or electrostatic bonding. With this process, the semiconductive sheet and the substrate are electrostatically pulled together and the temperature is such that, it is believed, both the substrate and insulating layer soften and thus flow or deform around the feedthroughs to effect the bond between the insulating layer and the substrate. The "bond" between insulating layer and feedthroughs and the substrate and feedthroughs is believed to be purely physical as between the feedthrough and the insulating layer but nevertheless such that an hermetic seal is provided between the inside of each cavity and the exterior thereof.

The semiconductive layer may be silicon with the facing being silicon dioxide or silicon nitride. The non-conductive substrate may be a glass which is compatible with the semiconductive material employed but conveniently it is that known as Corning 7070 or Schott 8248. The basic parameters in choosing the non-conductive substrate is that the bonding voltage, when field-assisted bonding is employed, is not dropped across the insulating layer, whereby the substrate must have a high electrical resistivity. Equally, the insulating layer must not be too thick and a thickness of approximately 450 nm has been found acceptable. The thicker the insulating layer, the better the electrical isolation of the electrical feedthrough and electrode and the lower the parasitic capacitance when the semiconductor device is of a capacitive type.

Each electrode and associated feedthrough may be of a two-layer construction, for example a layer of nickel chromium (NiCr) and gold (Au) although other metal combinations and alloys may be employed. The nickel chromium provides a very good adhesion to a glass substrate and gold provides a low resistivity electrical path.

The present invention will now be described in further detail, by way of example, with reference to the accompanying drawings, in which.

Figure 4:
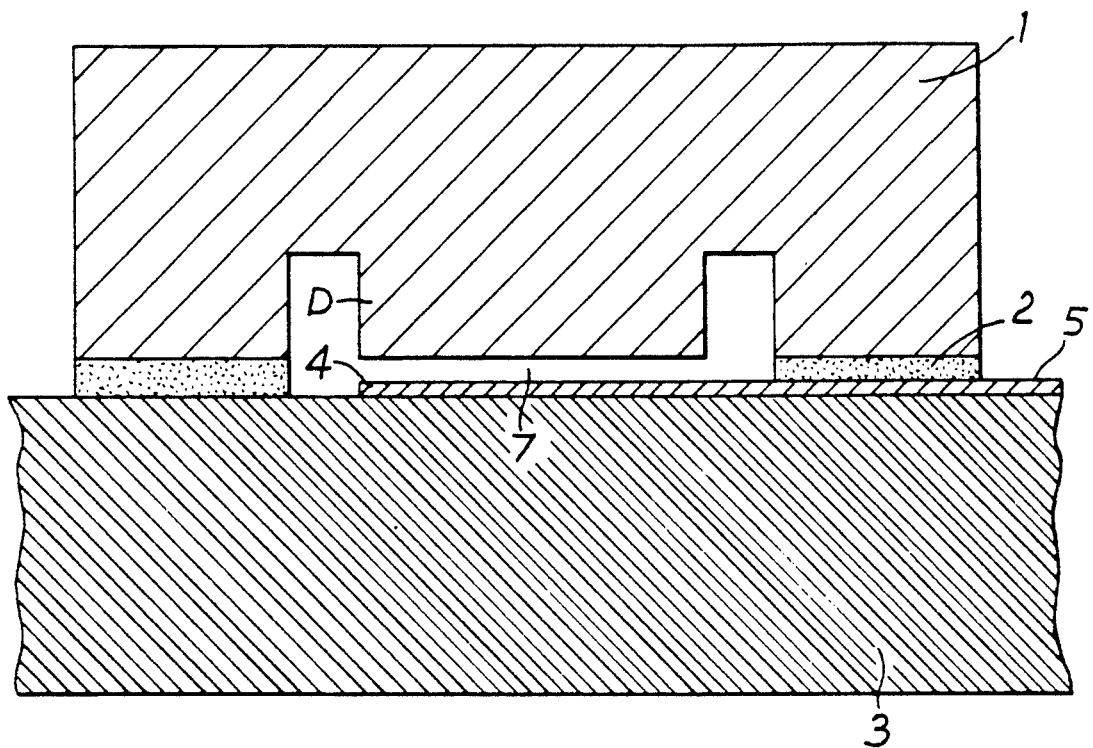
Figure 5:
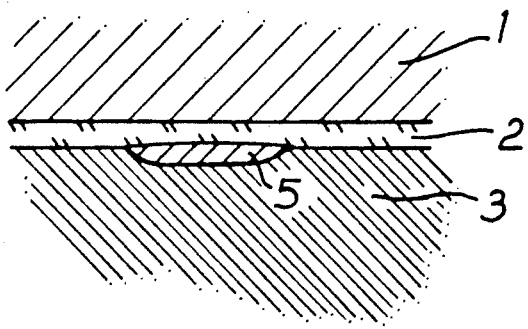
Figure 6:
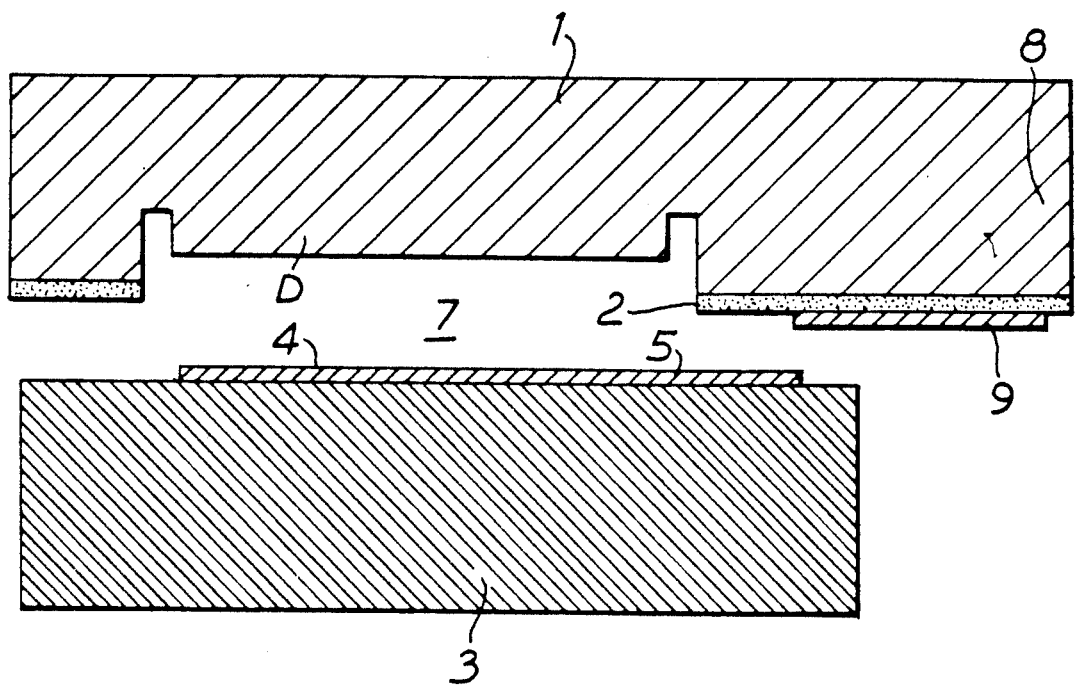
Figure 7:
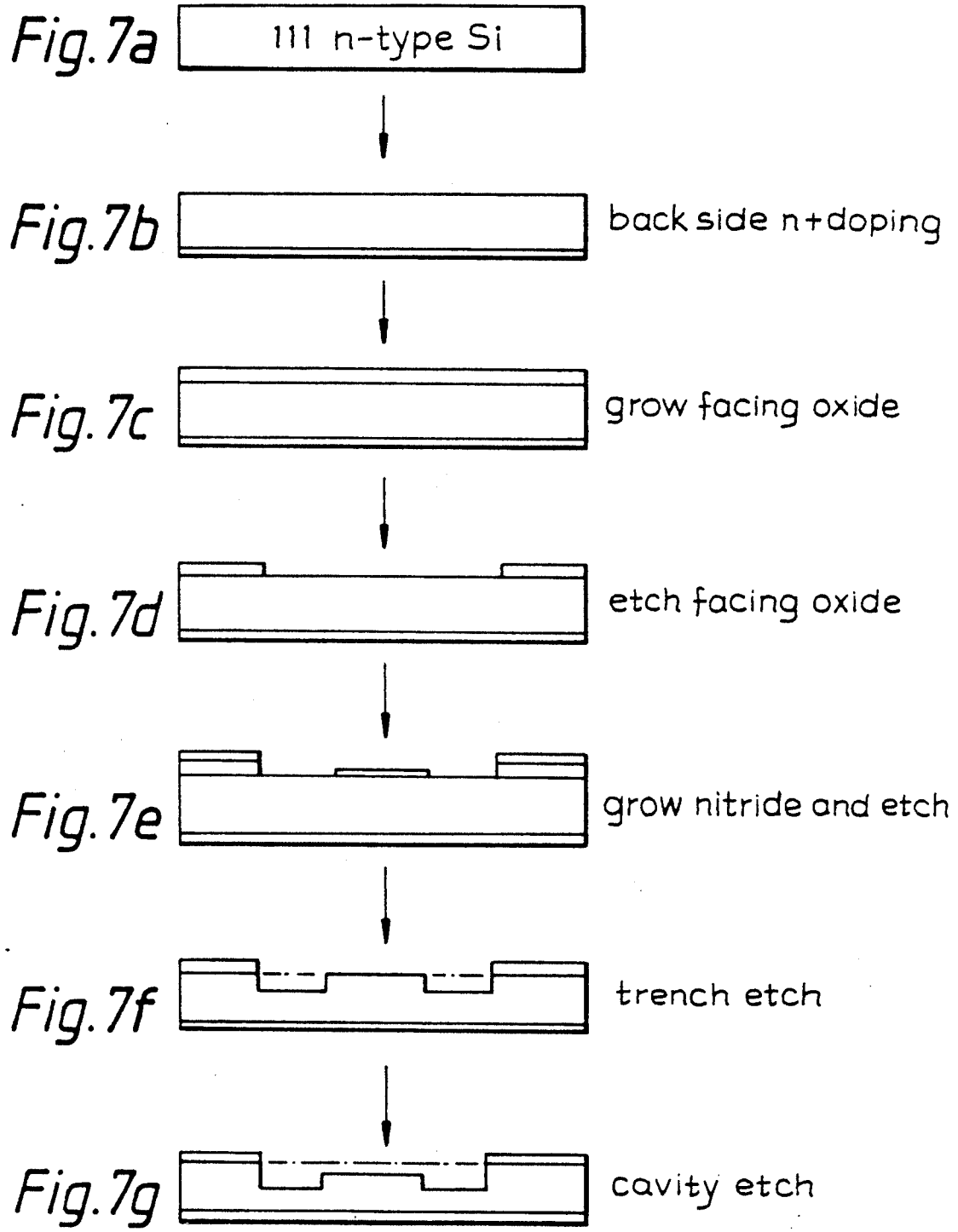
Figure 8:
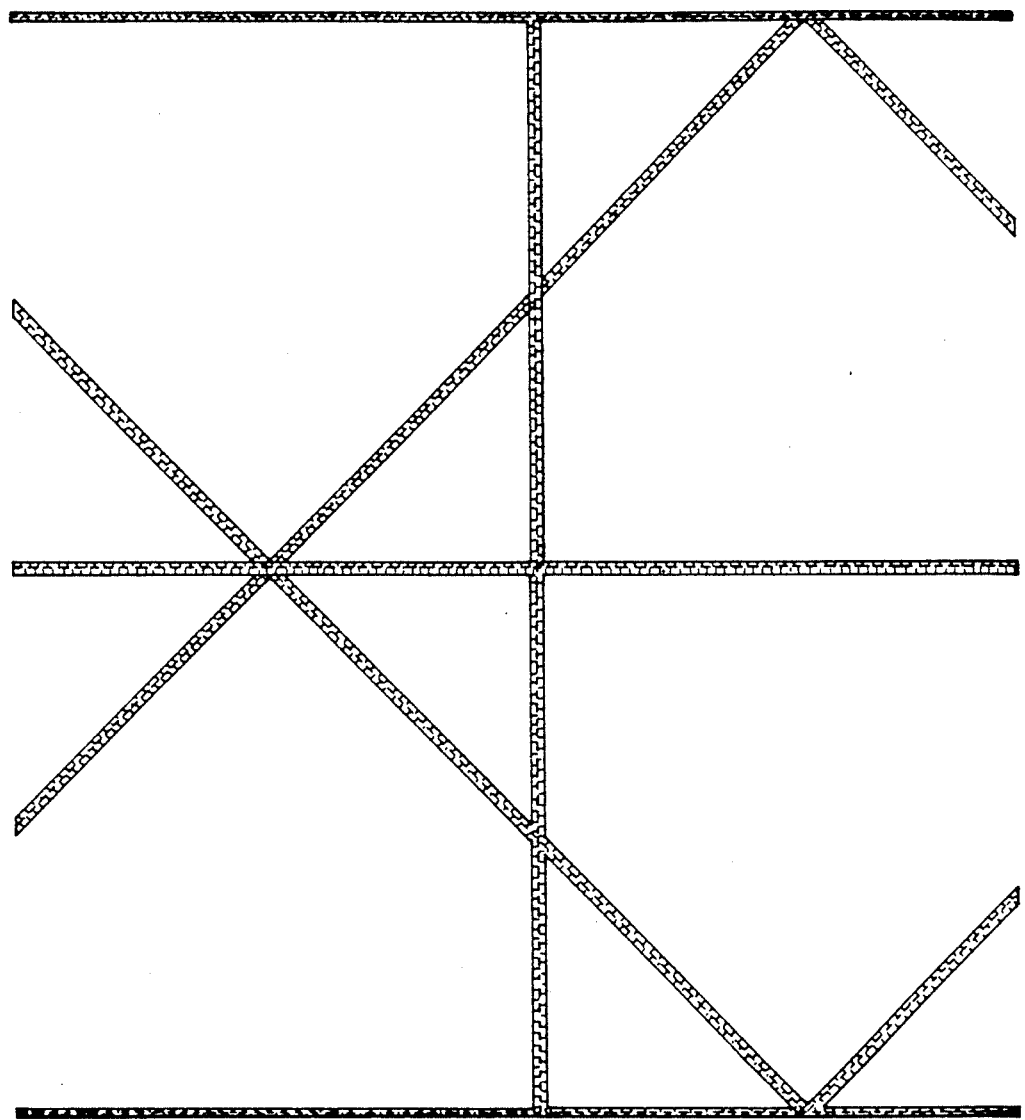
Figure 9:
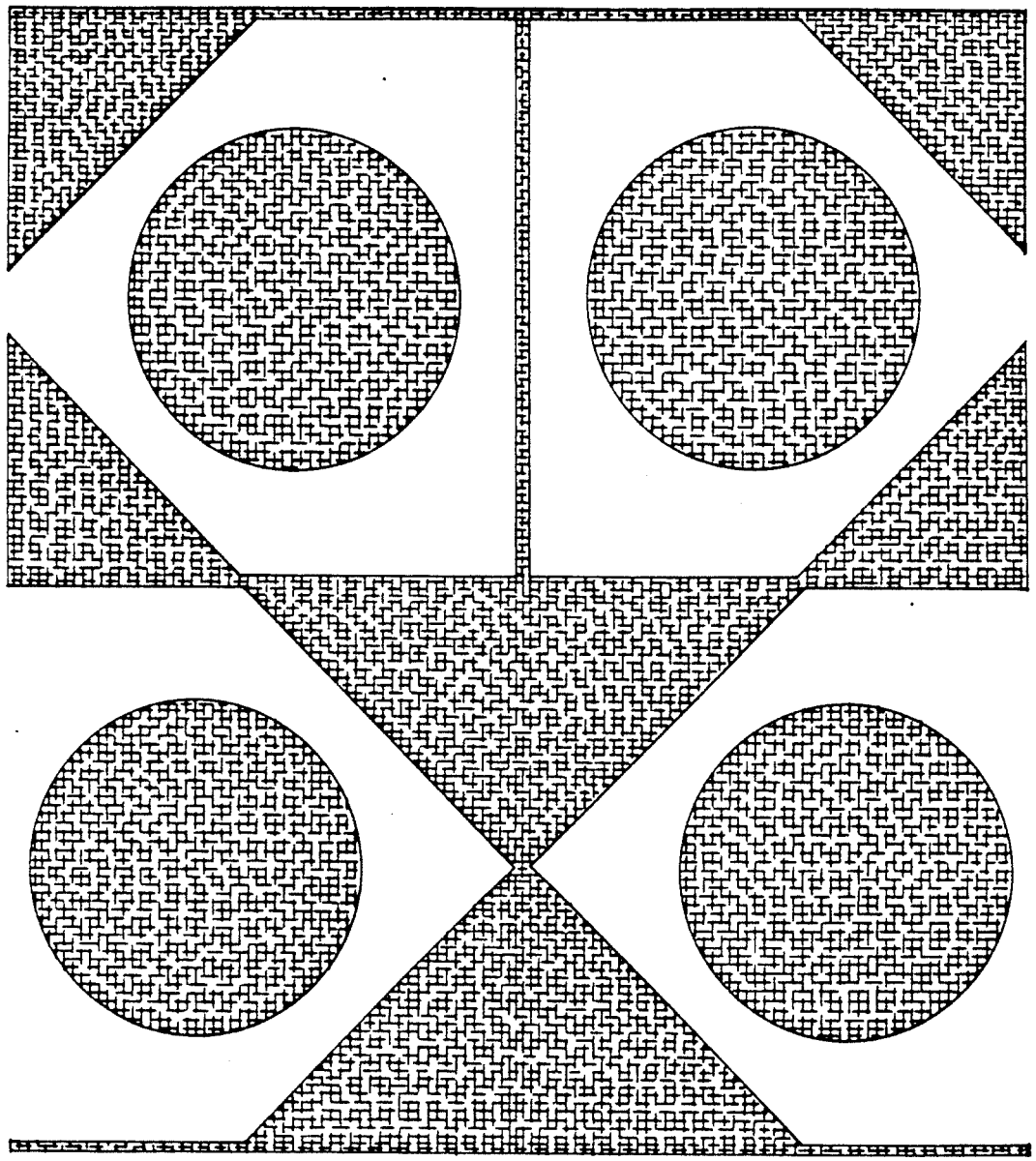

FIG. 4 is a cross-sectional view of a specific semiconductor device constructed in accordance with the present invention, FIG. 5 is a partial side view of FIG. 4, FIG. 6 is a view similar to that of FIG. 4 but showing an alternative embodiment, FIGS. 7a–7g are a diagrammatic representation of steps in a batch production process for producing semiconductive devices in accordance with the present invention, and FIGS. 8 to 11 illustrate various masks used in the process of FIG. 7.

Figure 1:
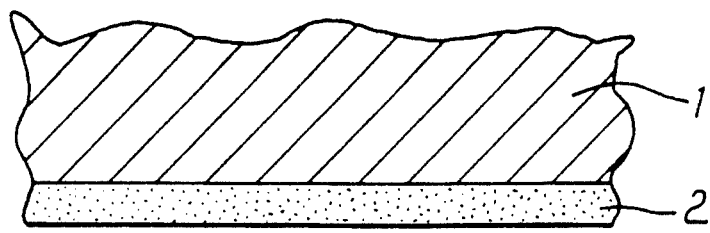
FIG. 1 illustrates a first stage in the method according to the invention.

Referring first to FIG. 1, this shows the basic components of a semiconductor device to be manufactured in accordance with the method of the present invention. The device comprises a semiconductive layer 1 provided with an insulating layer or facing 2. The semiconductive material may be silicon with the facing 2 being silicon dioxide or silicon nitride. The semiconductor device also comprises a non-conductive substrate 3 which may be a glass such as that known as Corning 7070 or Schott 8248, for example. The substrate 3 is provided with an electrode 4 with which is associated an electrical feedthrough 5 which is best seen in FIG. 4. The surface area of the silicon layer 1 is smaller than that of the substrate 3 so that when the former is placed on the latter, the, or each, electrical feedthrough 5 terminates beyond an edge of the semiconductive layer 1, again as best seen in FIG. 4.

Figure 2:
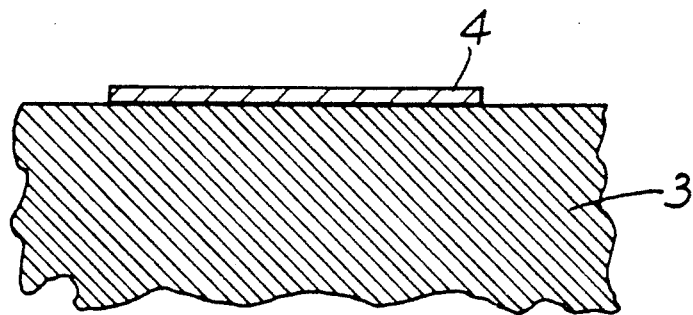
FIG. 2 illustrates a second but unsuccessful stage.
Figure 3:
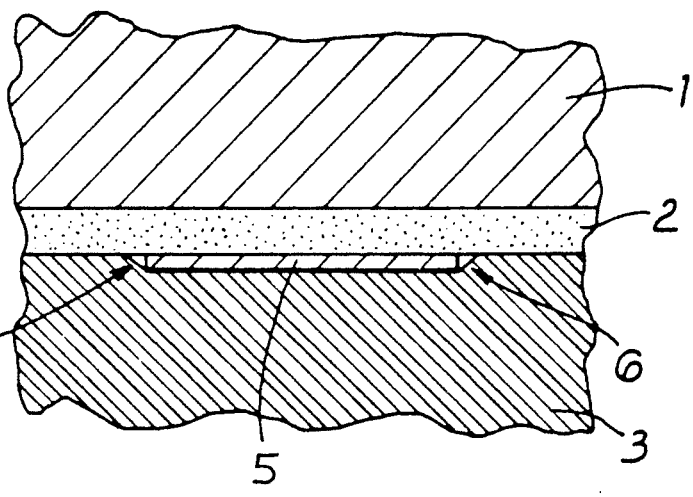
FIG. 3 illustrates a second and successful stage.

When the semiconductive layer 1 has been placed on the substrate 3, bonding of the two components together is carried out using the field-assisted bonding technique. Provided that the voltage and temperature during the bonding process are sufficiently high and that the metallisation producing the pad 4 and associated feedthrough 5 is not too thick, it is believed that the facing 2 and the substrate flow or are deformed around the electrical feedthrough 5 and extends right to the edge of the feedthrough to provide an hermetic seal without any through voids occurring such as illustrated in FIG. 2 at 6, this figure illustrating an unsuccessful bonding step resulting from incorrect bonding parameters such as voltage, temperature and time, for example. A successful bonding step is illustrated both in FIG. 3 and in FIG. 5.

The field assisted bonding process results in a thermocompression bond between the feedthrough 5 and the facing 2, i.e. in the specific embodiment between the gold and the silicon dioxide, to provide the hermetic seal. More specifically, the semiconductive layer 1, with the insulating layer 2, is electrostatically pulled towards the substrate 3, thus with a considerable force such that this "bond" between the feedthrough 5 and the insulating layer 2 on one side is purely physical but nevertheless such that a very satisfactory hermetic seal is achieved. The bond between the substrate 3 and the insulating layer on the other side is of a chemical nature. As already mentioned, the glass substrate 3 must have a high electrical resistivity such that the bonding voltage is not dropped across the facing which in itself must not be too thick.

FIGS. 4 and 5 illustrate a particular semiconductor device which has been produced according to the method of the present invention and is in the form of a capacitive pressure sensor. The sensor comprises a cavity 7 which is etched into the surface of the semiconductive layer 1 which is provided with the insulating layer or facing 2, the etching removing both a portion of the facing and the semiconductive layer itself. Thus, when the semiconductive layer 1 is bonded to the substrate 3, the semiconductive material acts as a diaphragm D and in use is thus movable with respect to the substrate 3 and more specifically with respect to the electrode 5. The bonding process of the semi-conductive layer 1 to the substrate 3 is in this case carried out in vacuo so that the cavity 7 is evacuated. Thus a pressure sensor is provided which can be used as an absolute pressure gauge. The pressure sensor may be batch produced as described in copending British Patent Application No. 8718639 which is incorporated herein by reference.

FIG. 6 shows an alternative embodiment in which the electrical connection to the electrical feedthrough is different. In this embodiment, the semiconductive layer 1 has a greater surface area than the substrate 3 so it overhangs the latter at one side at 8. The face 2 at the overhang 8 of the semiconductive sheet 1 is provided with metallisation 9 to form a feedthrough extension which is aligned with, and overlaps to a small extent, the basic feedthrough 5 which itself terminates short of the associated edge of the substrate 3. When the semiconductive layer 1 is bonded to the substrate 3, the feedthrough extension 9 is physically bonded to the basic feedthrough 5 at the overlap therewith and physically bonded to the substrate between the end of the feedthrough 5 and the edge of the substrate. This bond is similar to that which is effected between the feedthrough 5 and the insulating layer 2 discussed above. The feedthrough extension 9 beneath the overhang 8 is thus free for connection to an electrical lead.

A more detailed and specific example of carrying out a method according to the present invention is set out below.

EXAMPLE

Fabrication of Silicon Capacitive Pressure Sensors

For the batch production of silicon capacitive pressure sensors, the basic components used were a silicon wafer 2 and a glass disc 3 of similar diameter. A typical process for preparing the silicon wafer is given hereinafter under the heading "Silicon Sheet Processing". If p-type silicon is used, items 2 to 8 thereof can be omitted.

The glass components were machined into discs e.g. 75 mm diameter, 1.5 mm thick (thicker for high pressure devices) and registration flats machined to match those aligned with the grid pattern on the silicon wafers. The glass discs were polished to a surface finish better than 25 nm RMS.

Figure 10:
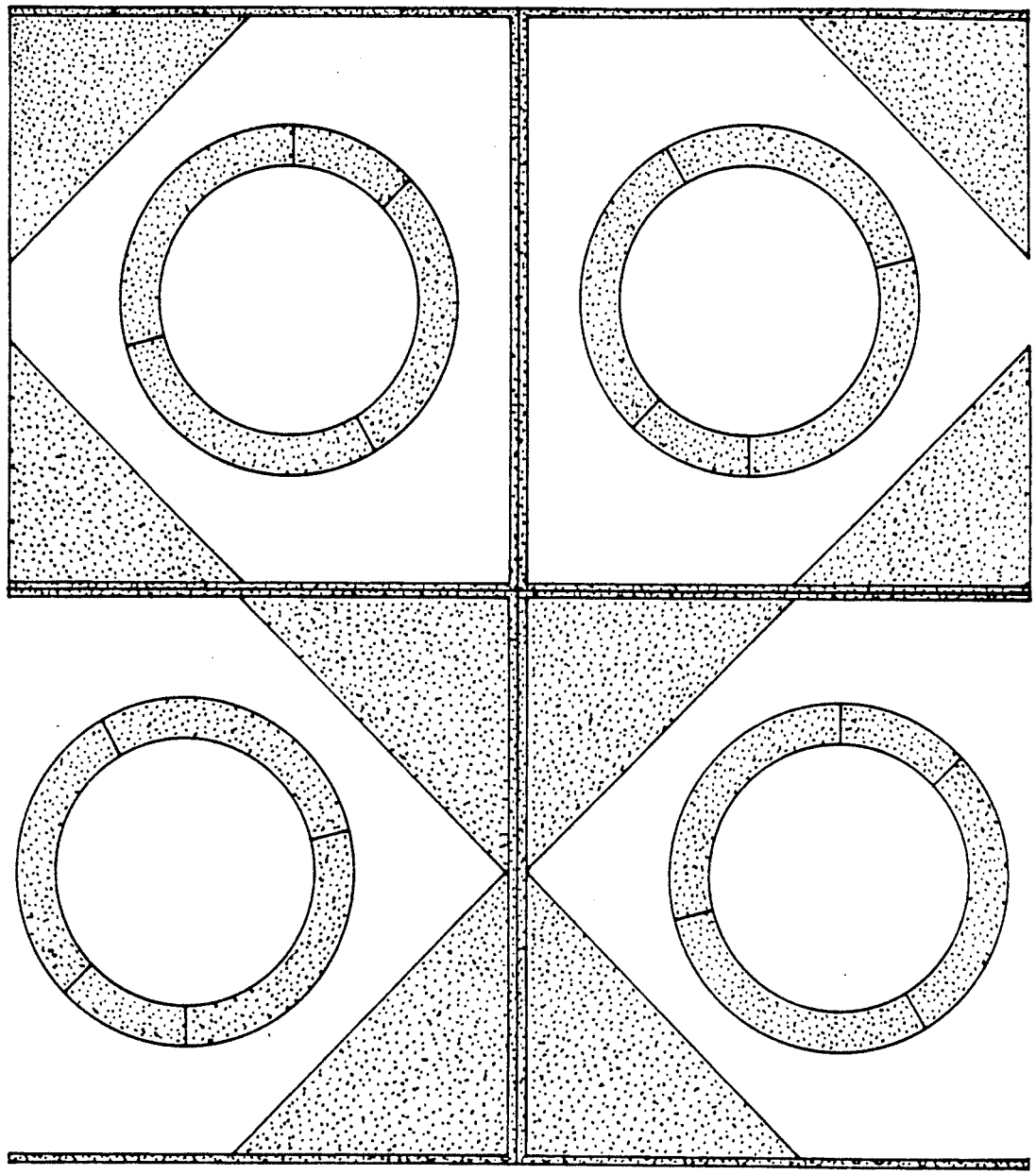
Figure 11:
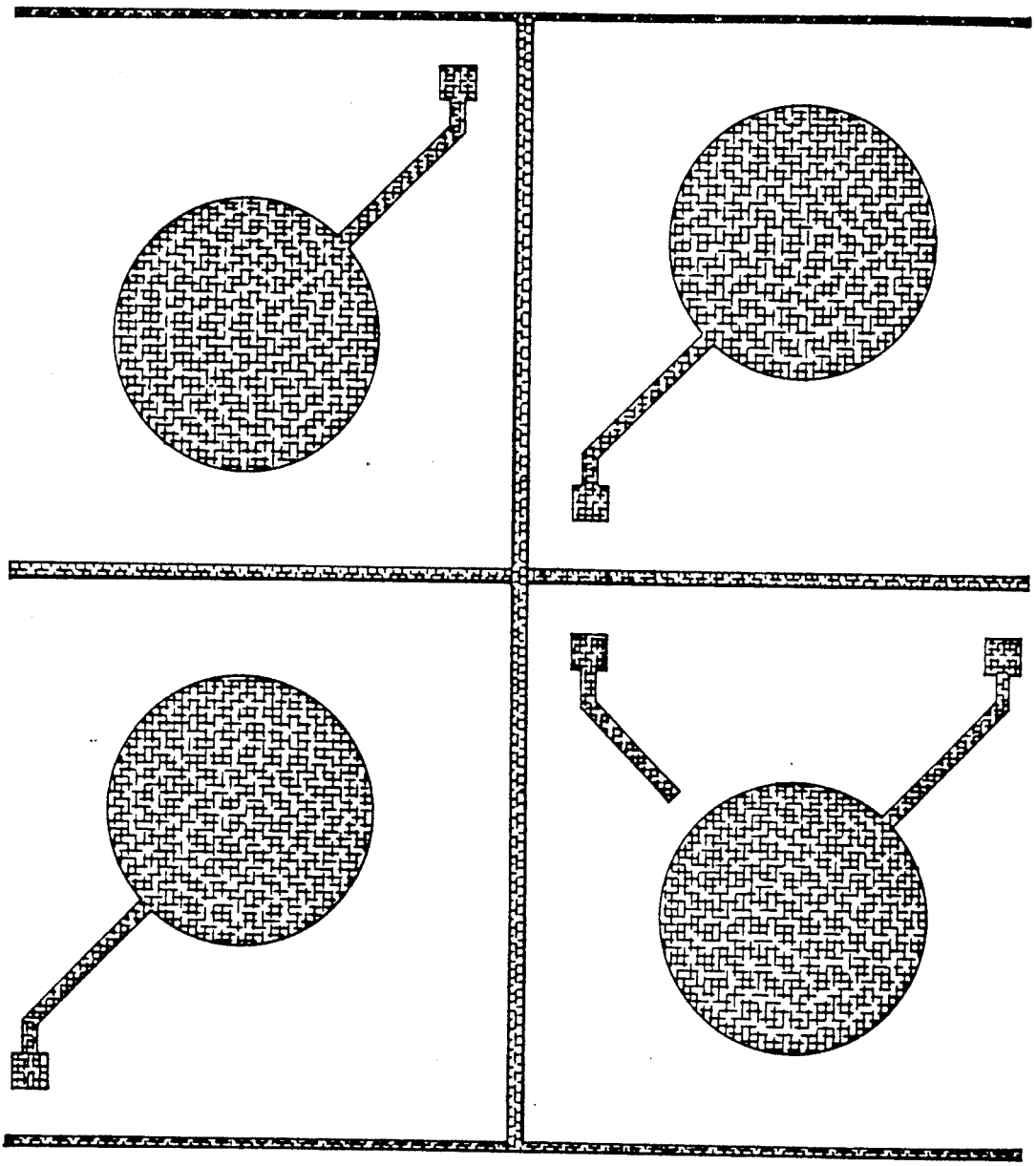

The glass discs were then patterned with positive resist using the mask of FIG. 10. It should be noted that this mask only has a dummy lead or feedthrough 7 on one out of four sensors. This is for experimental purposes, whereby a comparison can be made between sensors with and without dummy leads.

The glass discs were then coated sequentially with 10 nm of nichrome and 30 nm of gold using magnetron sputtering.

The photoresist was then removed leaving the metalisation 5,6,7 as defined by the mask of FIG. 10.

The silicon and glass components were then bonded together using field assisted bonding. This operation was performed in a vacuum to ensure a 'zero' pressure reference cavity 1 in each pressure sensor and to ensure good sensor temperature stability.

The samples were then heated to a temperature of 450° C. and a voltage of 2 kV (silicon positive) applied across the components after they had been pressed together (facing 4 against metallised glass 3). The voltage was applied for a period of 10 minutes.

This produces an hermetic seal between the internal cavity 1 and the outside with the metal leads or feedthrough 6,7 connecting the two regions, the facing 4 and the glass 3 having deformed around the edges of the feedthroughs to produce no leakage path, i.e. a hermetic seal.

Having bonded the components, the next process step was to deposit aluminium contact pads (approx. 1 micrometer thick) onto the silicon back side of each of the individual sensors. This is achieved using magnetron sputtering, in conjunction with a suitably machined mask. If another metal (e.g. gold/antimony) is used instead of aluminum, stages 2–8 of the silicon processing can be omitted for n-type silicon.

For forming devices of lower pressure ranges, the silicon is precision lapped or ground, prior to this deposition process, to the required thickness.

The next process step involved precision sawing. First diagonal cuts 10,11 were made into the silicon 2 following the diagonal registration flat on an 11.3 mm pitch. These cuts 10,11 stopped within 25 micrometers of the glass-silicon interface. The assembly was then diced along lines 8,9 into individual sensor components. This process caused the removal of the recessed corners 12,13 of each silicon section 2, hence exposing the contact pads on the glass 3.

The individual devices were then attached to headers, and gold leads wire bonded to the contact pads on the glass 3 and silicon 2.

After attaching a can containing a pressure port, the sensors are ready for testing.

It is essential that the silicon and glass preparation and the bonding of the two components are performed under clean conditions.

Silicon Sheet Processing

Material: 0.02 ohm-cm <111> Sb-doped 3" wafers.
1. RCA clean silicon wafers (FIG. 6a)
Back Side n+ Doping
2. Initial oxide : Grow 0.6 micrometers oxide in wet $O_2$; T=1100° C.
3. Spin resist on front.
4. Strip oxide from backs of wafers in 7:1 Buffered HF (BHF).
5. Strip resist in fuming nitric acid.
6. Phosphorus deposition furnace ($POCl_3$); T=1050° C; time=30 m; dry $N_2$.
7. Strip oxide in 7:1 BHF (FIG. 6b).
Grow Facing Oxide
9. Grow thermal oxide. T=1100° C.; wet $O_2$; time=180 min; expected $d_{ox}$=0.6 micrometers (FIG. 6c).
10. Measure oxide thickness, $d_{ox}$, by Nanospec. interference method.
Pattern Generation
11. Photolithography +ve resist using the mask of FIG. 7.
12. Machine registration flats aligned with grid pattern (including diagonal) of mask of FIG. 7. Wafers must then be thoroughly cleaned.
13. Photolithography +ve resist using the mask of FIG. 8.
14. Etch oxide in 7:1 BHF; expected etch time=12 min. (FIG. 6d).
15. Strip resist in fuming nitric acid.
16. $Si_3N_4$; $d_{Ni}$=150 nm (FIG. 6e).
17. Photolithography, +ve resist using the mask of FIG. 9.
18. Dry etch $Si_3N_4$; $d_{Ni}$=150 nm; Overetch by 50%.
19. Strip resist in fuming nitric acid.
Trench Etch
20. Silicon etch. Dip etch oxide in 20:1 BHF for 15 secs; then silicon etch in $HF:HNO_3 CH_3COOH$ for 2-3 mins. (Follows the mask of FIG. 9).
21. Measure etch depth. Repeat step 18 for time calculated to give an etch depth of 25 micrometers for the trenches 1' (FIG. 6f).
22. Strip $Si_3N_4$ in orthophosphoric acid; T=160° C.; strip time=90 mins.
Silicon Etch
23. Dry etch Si in $CCl_4$ to a depth of 2 micrometers (follows the mask of FIG. 8) to form the cavity 1 (FIG. 6g).
24. Measure thickness $d_{ox}$ at several points to ensure uniformity.

In devices such as the capacitive pressure sensor of FIG. 4 which have been produced using the method of the present invention, the insulating layer or facing 2 may be of the order of 450 nm thick, the thicker the layer the better the electrical isolation and the lower any parasitic capacitance although in the latter respect, a dummy feedthrough may be employed, again as disclosed in the copending British Patent Application referred to above. The two-layer film of metallisation may be produced by using a 10 nm thick layer of nickel chromium and a 30 nm thick layer of gold. Using this overall thickness of metallisation of 40 nm has enabled an hermetic seal to be accomplished around the feedthrough 5 at practical temperatures and voltages and produces low series resistance values, for example of the order of 15 ohms for 2 mm long 0.2 mm wide feedthrough 5. The hermetic seal achieved by the method according to the present invention has been tested in relation to a capacitive pressure sensor shown in FIG. 4 of the drawings, the capacitance thereof having been monitored for hundreds of hours under positive pressures without any significant drift occurring. This demonstrates the quality of the hermetic seal produced. The invention is also applicable to other devices such as accelerometers, for example.

It will be appreciated that the method of the present invention is relatively simple and yet achieves an effective hermetic seal and thus overcomes the problems associated with prior art attempts to achieve hermetic sealing. Accordingly, the invention constitutes a significant advance in the art of the manufacture of semiconductor devices because it eliminates costly extra steps to achieve the required seal and achieves very satisfactory sealing in a surprisingly simple manner.

We claim:

1. A semiconductor-on-insulator device having a hermetically sealed electrical feedthrough, constructed by:
    (a) producing an electrically insulating layer on a layer of a semiconductor material having a first surface area defined by a respective peripheral edge of the semiconductive layer;
    (b) producing one or more electrodes on a nonconductive substrate having a second surface area less than that of the first surface area of the semiconductive material and defined by a respective peripheral edge, with each electrode having an electrical feedthrough associated therewith at least partly on the nonconductive substrate;
    (c) providing a feedthrough extension on said insulating layer of said semiconductive layer, said feedthrough extension being for overlapping alignment with a respective feedthrough on said nonconductive substrate;
    (d) placing the semiconductive layer on the substrate, with the insulating layer in contact with the substrate and such that said feedthrough extension is in overlapping alignment with a respective said feedthrough on said substrate such that each electrical fedthrough including said feedthrough extension extends beyond a respective said peripheral edge of the substrate; and
    (e) bonding the semiconductive layer via the insulating layer thereon to the substrate to provide a hermetic seal around the feedthrough and thus protect the integrity of the electrode associated therewith between the semiconductive layer and the substrate, said feedthrough and feedthrough extension also being physically bonded together during said bonding of the semiconductive layer to the nonconductive substrate.

2. A semiconductor-on-insulator sensor having a hermetically sealed electrical feedthrough, comprising:
    a layer of semiconductive material having a first surface area defined by a respective peripheral edge of the semiconductive layer and having an electrically insulating layer thereon;
    a nonconductive substrate having a second surface area less than that of the first surface area and defined by a respective peripheral edge;

at least one electrode formed on said nonconductive substrate, each said electrode having an electrical feedthrough associated therewith at least partly on the nonconductive substrate;

each said electrical feedthrough including a respective feedthrough extension formed on said insulating layer of said semiconductor and being in overlapping alignment with and bonded to said respective feedthrough;

the insulating layer on said layer of semiconductive material being in contact with and having a bond to and with said substrate such that each said electrical feedthrough including said feedthrough extension thereby bonded thereto extends beyond a respective said peripheral edge of the substrate, said bond between said insulating layer on said semiconductive layer and said nonconductive substrate being such as to provide a hermetic seal between said semiconductor layer and said nonconductive substrate and around each said electrical feedthrough associated with a respective said electrode.

3. The semiconductor-on-insulator sensor of claim 2 wherein said insulating layer is approximately 450 nanometers thick, and each said electrode and associated feedthrough is approximately 40 nanometers thick.

4. A semiconductor-on-insulator sensor having a hermetically sealed electrical feedthrough, comprising:

a layer of semiconductive silicon having a first surface area defined by a respective peripheral edge of the semiconductive layer and having an electrically insulating layer of silicon dioxide of silicon nitride thereon;

a nonconductive substrate of glass having a second surface area different from that of the first surface area and defined by a respective peripheral edge;

at least one electrode formed on said nonconductive substrate, each said electrode having an electrical feedthrough associated therewith at least partly on the nonconductive substrate, each said electrode and associated feedthrough being of two-layer construction having a base layer of nickel chromium directly on said glass nonconductive substrate and a second layer of gold thereupon;

the insulating layer on said layer of semiconductive material being in contact with and having a bond to and with said substrate such that each said electrical feedthrough extends beyond a respective said peripheral edge of the semiconductive layer or substrate, said bond between said insulating layer on said semiconductive layer and said nonconductive substrate being a thermo-compression bond such s to provide a hermetic seal between said semiconductive layer and said nonconductive substrate and around each said electrical feedthrough associated with a respective said electrode; and wherein the semiconductive layer is etched at its surface facing the nonconductive substrate to define a cavity therebetween and such that said semiconductive layer serves as a pressure responsive diaphragm.

* * * * *